(12) United States Patent
Nishikawa et al.

(10) Patent No.: US 6,617,842 B2
(45) Date of Patent: Sep. 9, 2003

(54) SEMICONDUCTOR DEVICE TESTING METHOD AND SYSTEM EMPLOYING TRACE DATA

(75) Inventors: Katsumi Nishikawa, Tokyo (JP); Kazuo Shibata, Tokyo (JP)

(73) Assignees: NEC Corporation (JP); NEC Electronics Corporation (JP)

( * ) Notice: Subject to any disclaimer, the term of this patent is extended or adjusted under 35 U.S.C. 154(b) by 0 days.

(21) Appl. No.: 09/747,727

(22) Filed: Dec. 22, 2000

(65) Prior Publication Data

US 2001/0005132 A1 Jun. 28, 2001

(30) Foreign Application Priority Data

Dec. 24, 1999 (JP) .......................... 11-367492

(51) Int. Cl.[7] .............................................. G01R 31/26
(52) U.S. Cl. .................................. 324/158.1; 324/765
(58) Field of Search ........................ 324/765, 158.1; 714/718, 724, 738–744; 365/201

(56) References Cited

U.S. PATENT DOCUMENTS 5,010,552 A * 4/1991 Dias et al. .................. 714/742
5,841,960 A * 11/1998 Ibusuki et al. ............... 714/32
5,923,836 A * 7/1999 Barch et al. .................. 714/30
6,321,353 B2 * 11/2001 Debenham .................. 714/724

FOREIGN PATENT DOCUMENTS

JP  7-306245  11/1995

* cited by examiner

*Primary Examiner*—Kamand Cuneo
*Assistant Examiner*—Russell M. Kobert
(74) *Attorney, Agent, or Firm*—Hayes Soloway P.C.

(57) ABSTRACT

A method and apparatus for generating a test pattern enabling the detection of malfunctions produced when a semiconductor device is loaded on actual equipment prior to marketing. Using a logical analyzer, signal waveform data collected during the period of signal malfunction is acquired. This signal waveform data is converted by a test pattern generating device into a test pattern for automatic testing equipment. This test pattern is used to change data at the time of malfunction into normal data to generate a pattern of expected values for an output signal of the semiconductor device. Then, it is determined whether the input signal setting required for an output signal of the semiconductor device is present in the signal waveform data. If not, a test pattern for setting the input signal is generated. If the malfunction is reproduced in the testing equipment, the test pattern is used as a mass production test.

11 Claims, 13 Drawing Sheets

| State Number Decimal | command Symbols | Bank ADD Hex | ADD Hex | DQ63-DQ32 Hex | DQ31-DQ0 Hex | /CS3-0 Hex | /RAS Hex | /CAS Binary | /WE Binary | DQ47-0 Hex | ECC Error Binary |
|---|---|---|---|---|---|---|---|---|---|---|---|
| -40 | | 0 | 0000 | 04D3000 | 00000000 | 3 | 1 | 0 | 1 | 00 | 1 |
| -39 | | 0 | 0000 | 04D3000 | 00000000 | 3 | 1 | 0 | 1 | 00 | 1 |
| -38 | | 0 | 0000 | 04D3000 | 00000000 | 3 | 1 | 0 | 1 | 00 | 1 |
| -37 | | 0 | 03C0 | 04D3000 | 00000000 | 3 | 1 | 0 | 1 | 00 | 1 |
| -36 | | 0 | 03C0 | 04D3000 | 00000000 | 3 | 1 | 0 | 1 | 00 | 1 |
| -35 | | 0 | 0400 | 04D3000 | 00000000 | 3 | 1 | 0 | 1 | 00 | 1 |
| -34 | | 0 | 0400 | 04D3000 | 00000000 | 3 | 1 | 0 | 1 | 00 | 1 |
| -33 | | 0 | 0400 | 04D3000 | 00000000 | 3 | 0 | 0 | 1 | 00 | 1 |
| -32 | | 0 | 03C0 | 04D3000 | 00000000 | 3 | 0 | 0 | 1 | 00 | 1 |
| -31 | | 0 | 0000 | 04D3000 | 00000000 | 3 | 0 | 0 | 1 | 00 | 1 |
| -30 | | 0 | 0000 | 04D3000 | 00000000 | 3 | 1 | 1 | 1 | 00 | 1 |
| -29 | | 0 | 0000 | 04D3000 | 00000000 | 3 | 1 | 0 | 1 | 00 | 1 |
| -28 | | 0 | 0000 | 04D3000 | 00000000 | 3 | 1 | 0 | 1 | 00 | 1 |
| -27 | | 0 | 0000 | 04D3000 | 00000000 | 3 | 1 | 0 | 1 | 00 | 1 |
| -26 | | 0 | 0000 | 04D3000 | 00000000 | 3 | 1 | 0 | 1 | 00 | 1 |
| -25 | | 0 | 0000 | 04D3000 | 00000000 | 3 | 1 | 0 | 0 | 00 | 1 |
| -24 | | 0 | 039A | 04D3000 | 00000000 | 3 | 1 | 0 | 1 | 00 | 1 |
| -23 | Pre | 0 | 0BBF | 04D3000 | 00000000 | 3 | 0 | 1 | 0 | 00 | 1 |
| -22 | | 0 | 0CEA | 04D3000 | 00000000 | 3 | 1 | 1 | 1 | 00 | 1 |
| -21 | | 0 | 0CEA | 04D3000 | 00000000 | 3 | 1 | 0 | 1 | 00 | 1 |
| -20 | ACT | 0 | 0BBF | 04D3000 | 00000000 | 3 | 0 | 1 | 1 | 00 | 1 |
| -19 | | 0 | 0BBF | 04D3000 | 00000000 | 3 | 1 | 1 | 1 | 00 | 1 |
| -18 | READ | 0 | 0BBF | 04D3000 | 00000000 | 3 | 1 | 0 | 1 | 00 | 1 |
| -17 | | 0 | 0BBC | 04D3000 | 00000000 | 3 | 1 | 1 | 1 | 00 | 1 |
| -16 | | 0 | 0000 | 04D3000 | 00000000 | 3 | 1 | 1 | 1 | 00 | 1 |
| -15 | | 0 | 039A | 04D3000 | 00000000 | 0 | 1 | 1 | 1 | 00 | 1 |
| -14 | ACT | 1 | 16F5 | CFCE4477 | CBCACD60 | 3 | 0 | 1 | 1 | 00 | 1 |
| -13 | | 1 | 1190 | C7C64476 | C3C2C140 | 3 | 1 | 1 | 1 | 00 | 1 |
| -12 | READ | 1 | 1190 | BFBE77BB | BBBA9D30 | 3 | 1 | 0 | 1 | 00 | 1 |
| -11 | | 1 | 1190 | B78677BA | B3B29110 | 0 | 1 | 1 | 1 | 00 | 1 |
| -10 | | 1 | 11AA | B78677BA | B3B29110 | 3 | 1 | 1 | 1 | 00 | 1 |
| -9 | READ | 1 | 11AA | B78677BA | B3B29110 | 3 | 1 | 0 | 1 | 00 | 1 |
| -8 | | 1 | 11AA | B78677BA | 00901480 | 0 | 1 | 1 | 1 | 00 | 1 |
| -7 | | 1 | 1BA8 | 00004000 | 0090348D | 3 | 1 | 1 | 1 | 00 | 1 |
| -6 | READ | 1 | 1BA8 | A02C2147 | 02860001 | 3 | 1 | 0 | 1 | 00 | 1 |
| -5 | | 1 | 1000 | 00000400 | 00900000 | 0 | 1 | 1 | 1 | 00 | 1 |
| -4 | | 1 | 1BA8 | 00000000 | 00903401 | 3 | 1 | 1 | 1 | 00 | 1 |
| -3 | READ | 1 | 119F | 00004000 | 009020BC | 3 | 1 | 0 | 1 | 00 | 1 |
| -2 | | 1 | 119F | A02C2117 | 00900000 | 0 | 1 | 1 | 1 | 00 | 1 |
| -1 | | 0 | 0BBF | 00000000 | 00900000 | 3 | 1 | 1 | 1 | 00 | 0 |
| 0 | | 0 | 0000 | A02C1537 | E1979026 | 3 | 1 | 0 | 1 | 00 | 0 |
| 1 | | 0 | 0BBC | A02C155F | 80D84484 | 3 | 1 | 1 | 1 | 00 | 0 |

MALFUNCTION →

ECC ERROR OCCURS →

COLUMN POSITION INFORMATION

FIG. 5

| ITEM | START OF RETRIEVAL (STORE START POSITION) | END OF RETRIEVAL (COUNT NUMBER OF CLOCKS) |
|---|---|---|
| tREF | REF | REF |
| tRC(CBR) | REF | REF ACT |
| tRAS | ACT | PRE OWN WRITE(AP)OWN READ(AP)OWN |
| tRP | PRE | ACT OWN REF |
| tRRD | ACT | ACT OTHER |
| tRCD | ACT | WRITE OWN READ OWN |
| tDPL | WRITE | PRE OWN |
| tDAL | WRITE(AP) | ACT OWN REF |
| W to W | WRITE | WRITE |
| W to R | WRITE | READ |
| R to R | READ | READ |
| R to W | READ | WRITE |

FIG. 7

```
Item          : states (min)      (appear)       states (max)   (appear)
-----------------------------------------------------------------------------
REF to REF:   1903 clks        ( -46334)        1937 clks    ( -48271)
tRC (CBR) :      9 clks        (   -271)          48 clks    (-643462)
tRAS      :      7 clks        ( -35358)        1915 clks    (-822015)
tRP       :      3 clks        (    -23)         101 clks    (-164216)
tRRD      :      2 clks        (  -5950)        1308 clks    (-875770)
tRCD      :      3 clks        (    -13)          58 clks    (-165643)
tDPL      :      3 clks        (   -972)        1891 clks    (-403445)
WRT to WRT:      4 clks        (   -476)          28 clks    (-987653)
WRT to RED:      4 clks        (   -614)         210 clks    (-162819)
RED to RED:      4 clks        (     -6)          73 clks    (-892410)
RED to WRT:      8 clks        (   -682)          34 clks    (-989331)
MRS command :    0
DQM command :    0
Auto Precharge : 0
PRE Termination: 0
Self Interrupt : 0            (OWN BANK Interruption)
Other Interrupt: 0            (OTHER BANK Interruption)
```

Items above brace "states (min)" through "states (max) (appear)": CHECK VARIOUS TIMINGS Items for MRS command through Other Interrupt: NUMBER OF TIME OF USE OF COMMANDS

FIG. 8

<DEFINING SENTENCE>

| | | | | |
|---|---|---|---|---|
| NOP | CS PALL B0 | | YT Q TS2 ;???????? | |
| NOP | NOP B0 | | YT Q TS2 ;???????? | |
| NOP | NOP B0 | | YT Q TS2 ;???????? | |
| NOP | NOP B0 | | YT Q TS2 ;???????? | |
| NOP | READ B0 | YT<#000 | YT Q TS2 ; | -40 |
| NOP | READ B0 | YT<#000 | YT Q TS2 ; | -39 |
| NOP | READ B0 | YT<#3C0 | YT Q TS2 ; | -38 |
| NOP | READ B0 | YT<#3C0 | YT Q TS2 ; | -37 |
| NOP | READ B0 | YT<#000 | YT Q TS2 ; | -36 |
| NOP | PALL B0 | YT<#000 | YT Q TS2 ; | -35 |
| NOP | REF B0 | YT<#000 | YT Q TS2 ; | -34 |
| NOP | REF B0 | YT<#000 | YT Q TS2 ; | -33 |
| NOP | REF B0 | YT<#3C0 | YT Q TS2 ; | -32 |
| NOP | REF B0 | YT<#000 | YT Q TS2 ; | -31 |
| NOP | READ B0 | YT<#000 | YT Q TS2 ; | -30 |
| NOP | READ B0 | YT<#000 | YT Q TS2 ; | -29 |
| NOP | READ B0 | YT<#000 | YT Q TS2 ; | -28 |
| NOP | READ B0 | YT<#000 | YT Q TS2 ; | -27 |
| NOP | READ B0 | YT<#000 | YT Q TS2 ; | -26 |
| NOP | READ B0 | YT<#000 | YT Q TS2 ; | -25 |
| NOP | READ B0 | YT<#000 | YT Q TS2 ; | -24 |
| NOP | CS PRE B0 | YT<#7BF | YT Q TS2 ; | -23 |
| NOP | READ B0 | XT<#CEA | YT Q TS2 ; | -22 |
| NOP | ACT B0 | XT<#CEA | XT P TS2 ; | -21 |
| NOP | CS ACT B0 | YT<#7BF | XT P TS2 ; | -20 |
| NOP | READ B0 | YT<#7BF | YT Q TS2 ; | -19 |
| NOP | READ B0 | YT<#7BF TP<#C | YT Q TS2 ; | -18 |
| NOP | CS READ B0 | YT<#7BC TP<#C | YT Q TS2 ; | -17 |
| NOP | READ B0 | YT<#000 TP<#B | YT Q TS2 ; | -16 |
| NOP | READ B0 | YT<#39A TP<#B | YT Q TS2 ; | -15 |
| NOP | READ B0 | XT<#6F5 | YT Q TS2 ; | -14 |
| NOP | CS ACT B1 | YT<#190 | XT P TS2 ; | -13 |
| NOP | READ B1 | YT<#190 | YT Q TS2 ; | -12 |
| NOP | READ B1 | YT<#190 TP<#9 | YT Q TS2 ; | -11 |
| NOP | CS READ B1 RF | YT<#1AA TP<#9 | YT Q TS2 ; | -10 |
| NOP | READ B1 RF | YT<#1AA TP<#9 | YT Q TS2 ; | -9 |
| NOP | READ B1 RF | YT<#1AA TP<#9 | YT Q TS2 ; | -8 |
| NOP | READ B1 RF | YT<#1AA TP<#9 | YT Q TS2 ; | -7 |
| NOP | CS READ B1 | YT<#7A8 TP<#9 | YT Q TS2 ; | -6 |
| NOP | READ B1 | YT<#000 TP<#9 | YT Q TS2 ; | -5 |
| NOP | READ B1 | YT<#7A8 TP<#9 | YT Q TS2 ; | -4 |
| NOP | READ B1 | YT<#19F TP<#9 | YT Q TS2 ; | -3 |
| NOP | CS READ B1 | YT<#19F TP<#D | YT Q TS2 ; | -2 |
| NOP | READ B1 | YT<#19F | YT Q TS2 ; | -1 |
| NOP | READ B1 | YT<#73F | YT Q TS2 ; | 0 |
| NOP | READ B0 | YT<#000 | YT Q TS2 ; | 1 |
| NOP | READ B0 | YT<#7BC | YT Q TS2 ; | 2 |
| NOP | READ B0 | | YT Q TS2 ; | 3 |

↑
COMMAND TO PATTERN PROCESSOR

INPUT/OUTPUT PATTERN

PATTERN FOR MATCHING
- INITIALIZE
- BACK AND WRITE
- WRITE TO BIT TO BE SPECIFIED

PATTERN PROGRAM CONVERTED FROM TRACE PATTERN

STROBE SET IN SPECIFIED LOCATION

BAD TRACE DATA IS CHANGED TO CORRECT VALUE

FIG. 9

| COMMAND | ADD | IA | X | Y |
| --- | --- | --- | --- | --- |
| ACT | #2 | | #2 | |
| NOP | | | #2 | |
| NOP | | | #2 | |
| NOP | | | #2 | |
| READ | #3 | | #2 | #3 |
| NOP | | | #2 | #2 |
| NOP | | | #2 | #1 |
| NOP | #2 | #2 | #2 | #0 |
| ACT | #5 | #2 | #5 | #3 |

FIG. 12

SEMICONDUCTOR DEVICE TESTING METHOD AND SYSTEM EMPLOYING TRACE DATA

FIELD OF THE INVENTION

The present invention relates to a testing technique for a semiconductor device. More particularly, it relates to a method, a device and a system for testing in which a test pattern for inspection is prepared based on trace data in the operating state of the semiconductor device mounted on implemented equipment, and to software therefor.

BACKGROUND OF THE INVENTION

In characterization tests for a semiconductor device, which are conducted in the course of research and development, a series of comprehensive tests are carried out. These include tests such as various operational margin tests with varying power or timing, in addition to DC parametric tests, functional tests or AC parametric tests for semiconductor devices. For example, high-performance automatic testing equipment (ATE) using sampling data prescribing operational specifications for semiconductor devices can be used.

In the manufacturing process for a semiconductor device, a mass production test, also termed a final test, is carried out on a packaged semiconductor device following a wafer test and dicing and bonding steps to guarantee that the semiconductor device meets minimum electrical specifications. Usually, on a device under test (DUT), continuity and leakage tests, basic functional tests, DC parametric tests and, as necessary, minimum margin tests are performed using a low-cost automatic testing device for mass production. The automatic testing equipment is connected to an auto-handler which sorts the devices tested according to classes and grades (or categories) based on test results.

In this final test, shorter test time is of paramount importance, so that test items and test patterns selected as necessary minimum items may be used in testing without performing comprehensive tests.

However, there are occasions in which a semiconductor device product, verified to be good in the final test stage and marketed, suffers from malfunctions when mounted and operated on electronic equipment.

In other words, the final test is usually conducted using low-cost automatic testing equipment. Hence, there is a limit to the pattern length of a test pattern (test vector length) or the number of different patterns for functional tests. For example, a device failure undetectable with a test pattern used in a final test is sometimes detected by haphazard after product shipment.

With recent progress in device miniaturization, leading to high integration and high functionality, the number of gates mounted on a single chip is drastically increased. The increased logical complexities of these chips make it more and more difficult to provide test patterns capable of detecting all of the defects dependent on combinations of input/output patterns of the logical integrated circuits. In the case of a program-controlled logic IC, particularly, the combination of input/output patterns to the logical IC is varied depending on the contents, the operating (running) states, or the haphazard phenomenon. Thus, in reality it is almost impossible to provide all of these combinations for testing logical ICs at the outset.

Several methods are currently employed for generating a test pattern for use in automatic testing equipment that tests semiconductor devices. Among these methods, one method uses a tool for converting the simulated result obtained by a logical simulator used in designing a semiconductor device into a test pattern for conversion to a test pattern for automatic testing equipment in question. Another method uses an automatic pattern generating tool (APG). A third method generates a test pattern and uses a failure simulator taking into account the rate of failure detection. These methods generate test patterns based on simulation.

As another method, a test pattern is acquired by using a real device. As a typical time-honored technique, a previously provided input pattern (random pattern) is applied to a Known Good Device (KGD) to sample an output from the KGD. The sampled output as a pattern of expected values is synthesized with an input pattern to generate a test vector.

There is another device for generating a test pattern that acquires a signal waveform in the course of the operation with the semiconductor integrated device mounted on implemented equipment. As described in JP Patent Kokai JP-A-7-306245, a well-known method involves sampling a terminal waveform of a semiconductor integrated device mounted on implemented equipment, appending the input/output information input by a manufacturer of the implemented equipment as to the terminal waveform, using a waveform editor of testing equipment, and acquiring a test pattern for inspection from the resulting data. In this method, the pattern quality is appreciably influenced by whether the input/output information acquired from the manufacturer of the implemented equipment is the correct information. The above-mentioned JP Patent Kokai JP-A-7-306245 proposes a testing method comprising: pattern generating means made up of a data conversion circuit for acquiring the signal waveform data at the time of operation at the terminal of an LSI under test by a logic analyzer and converting the data into an input pattern for testing, and a data memory for storing an input pattern output by the data conversion circuit; a voltage setting means for setting a variety of voltages, inclusive of a source voltage VDD, a high level input voltage VIH, a low level input voltage VIL, and a grounding voltage, for providing a difference in input and output current values produced by the driving input of a preset input pattern and supplying the so-set voltages to the LSI; and an input/output information holding means for receiving an input pattern output by pattern generating means for applying the input pattern received to a specified terminal designated for current measurement to measure the input and output currents produced in the specified terminal designated for current measurement to measure the input and output currents produced in the specified terminal, detecting the difference between the input and output currents, verifying PASS/FAIL in the input pattern and extracting and holding the FAIL information. The input pattern for testing, generated by the pattern generating means, is synthesized with the FAIL information output by the input/output information holding means, to generate a test pattern for inspection corresponding to the LSI. The entire disclosure of JP-A-7-306245 is herein incorporated by reference.

SUMMARY OF THE DISCLOSURE

However, various problems have been encountered during investigations toward the present invention. Namely, in the current state of the art, there is provided no tool for reflecting the malfunction information pertinent to the semiconductor device products when a test pattern of testing equipment is used during a run on implemented equipment.

If malfunction or failures (flaws) occur on the implemented equipment, and the semiconductor device product is responsible for the failure, the semiconductor device product is exchanged with a KGD, by way of a repair service to check whether or not the implemented equipment operates normally. If, as a result of such exchange, the implemented equipment operates normally, the result is acceptable to a user. However, there are occasions on which the malfunction is not resolved even by exchange with a KGD. For example, if the semiconductor device is a program-controlled CPU or a peripheral device, memory device etc., adapted for exchanging data with a program-controlled CPU, the input/output pattern or the timing might change, thereby producing a malfunction as a result of the failure of a device with respect to a certain combination of randomly occurring pattern sequences due to changes in the input/output pattern or timing depending on the operating states or programs executed on the CPU.

Even if, in such a case, the semiconductor device is exchanged for a KGD and mounted on the implemented equipment, the KGD may undergo malfunction for such a specific pattern combination.

If the malfunction of the semiconductor device is not resolved, such that the manufacturer has to recover the products, considerable loss is incurred. On the other hand, it takes considerable labor and operating steps to analyze the defects of the semiconductor device to produce a test pattern having a pattern sequence for detecting the specific malfunction.

It is therefore an object of the present invention to provide a method, apparatus and program product for generating a test pattern enabling detection of malfunction on mounting on implemented equipment in advance, such as at the time of production tests. Other objects, advantages and features of the present invention will be apparent from the entire description of the present invention and the claims.

According to a first aspect of the present invention, there is provided a method for testing a semiconductor device comprising the steps of:

a first step of acquiring signal waveform data for a time period beginning with a first time point going back from occurrence time of a malfunction of a first semiconductor device and running to a second time point inclusive of the malfunctioning time of the semiconductor device, in connection with a preset terminal signal of the semiconductor device;

a second step of generating a test pattern usable in an automatic testing device adapted for testing the semiconductor device as a device to be measured, from the acquired signal waveform data, the test pattern comprising data for the malfunctioning time changed into normal data; and a third step of testing a semiconductor device of a same series of production as the first semiconductor device, as a semiconductor device under test, using the so-generated test pattern in the automatic testing device.

In the first step of the above-described method, the implemented equipment carrying the semiconductor device is run in operation and signal waveform data of a preset group of terminals of the semiconductor device is acquired using a logical analyzer employing a preset failure signal indicating the malfunction of the semiconductor device as a trigger.

In the second step of the above-described method, as data for the malfunctioning time is changed into normal data to prepare a pattern of expected values for an output signal of the semiconductor device, it is checked whether or not setting of an input signal to the semiconductor device is present in the test pattern. If the setting is not present in the test pattern, a test pattern for setting the input signal to the semiconductor device is automatically inserted.

According to a second aspect of the present invention, there is provided a system for testing a semiconductor device. The system comprises:

an acquiring unit acquiring signal waveform data for a time period beginning with a first time point going back from occurrence time of a malfunction of a first semiconductor device and running to a second time point inclusive of the malfunctioning time of semiconductor device, in connection with a signal at a preset terminal of the semiconductor device; and a generator unit generating a test pattern usable in an automatic testing device adapted for testing the semiconductor device as a device under test, from the acquired signal waveform data, the test pattern comprising data for the malfunctioning time changed into normal data;

wherein in the automatic testing device, a semiconductor device of a same series of production as the first semiconductor device, as a semiconductor device to be measured, is tested using the so-generated test pattern.

According to a third aspect of the present invention, a mass production tester conducts a test on a semiconductor device (or devices), which is of the same series (type) of production as a semiconductor device product, using a test pattern or a test program output by a pattern generating device adapted for automatically converting the signal waveform data at the time of occurrence of defects in the semiconductor device products mounted on an implemented equipment into a test pattern or program for inspecting the semiconductor device.

According to a fourth aspect of the present invention, there is provided a pattern generating device. In the pattern generating device, signal waveform data from means for acquiring signal waveform data for a time period beginning with a first time point going back from the time of occurrence of a malfunction of a semiconductor device and running until a second time point inclusive of the malfunctioning time of the semiconductor device, is input in connection with a terminal signal of the semiconductor device. A test pattern usable in an automatic testing equipment adapted for testing the semiconductor device as a device under test is acquired from the acquired signal waveform data, with the test pattern comprising data for the malfunctioning time changed into normal data. The data for the malfunctioning time is changed to normal data to generate a pattern of expected values for the output signals of the semiconductor device. If the setting required in association with the output signal of the semiconductor device is not present in the test pattern, an input signal to the semiconductor device is set by an input signal setting unit.

According to a 5th aspect of the present invention, there is provided a method for generating a test pattern comprising:

acquiring signal waveform data for a time period beginning from a first time point going back from occurrence of a malfunction of a first semiconductor device and running to a second time point inclusive of a malfunctioning time of the semiconductor device, in connection with a signal at a preset terminal of the semiconductor device; and preparing a test pattern usable in an automatic testing device adapted for testing the semiconductor device as a device under test, from the acquired signal waveform data, the test pattern comprising data for the malfunctioning time changed into normal data;

wherein data for malfunction is changed into normal data to prepare a pattern of expected values for an output signal of the semiconductor device, it is checked whether or not setting of an input signal required in association with the output signal of the semiconductor device is present in the signal waveform pattern, provided that if the setting is not present in the test pattern, a test pattern for setting the input signal to the semiconductor device is automatically inserted.

According to a 6th aspect of the present invention, there is provided a computer readable program product for performing the steps of the method. The program product may be carried on any carrier, which may be a hard, soft or dynamic carrier such as diskette, CD, memory, or carrier wave, or else whatever that may carry the program product.

Other aspects and features are also mentioned in the appended claims, the entire disclosure thereof being incorporated therein by reference thereto.

BRIEF DESCRIPTION OF THE DRAWINGS

FIG. 5 shows a typical display output signal waveform data (trace data) in an embodiment of the present invention.

FIG. 7 shows a tabulated list of the processing operations performed by the operation analysis unit of an embodiment of the present invention.

FIG. 8 shows typical output analysis results of an operation analysis unit of an embodiment of the present invention.

FIG. 9 shows a typical test pattern (pattern program) automatically generated by a pattern generating device according to an embodiment of the present invention.

FIG. 12 illustrates a pattern sequence used in reproducing malfunctions in an embodiment of the present invention.

PREFERRED EMBODIMENTS OF THE INVENTION

Figure 1:
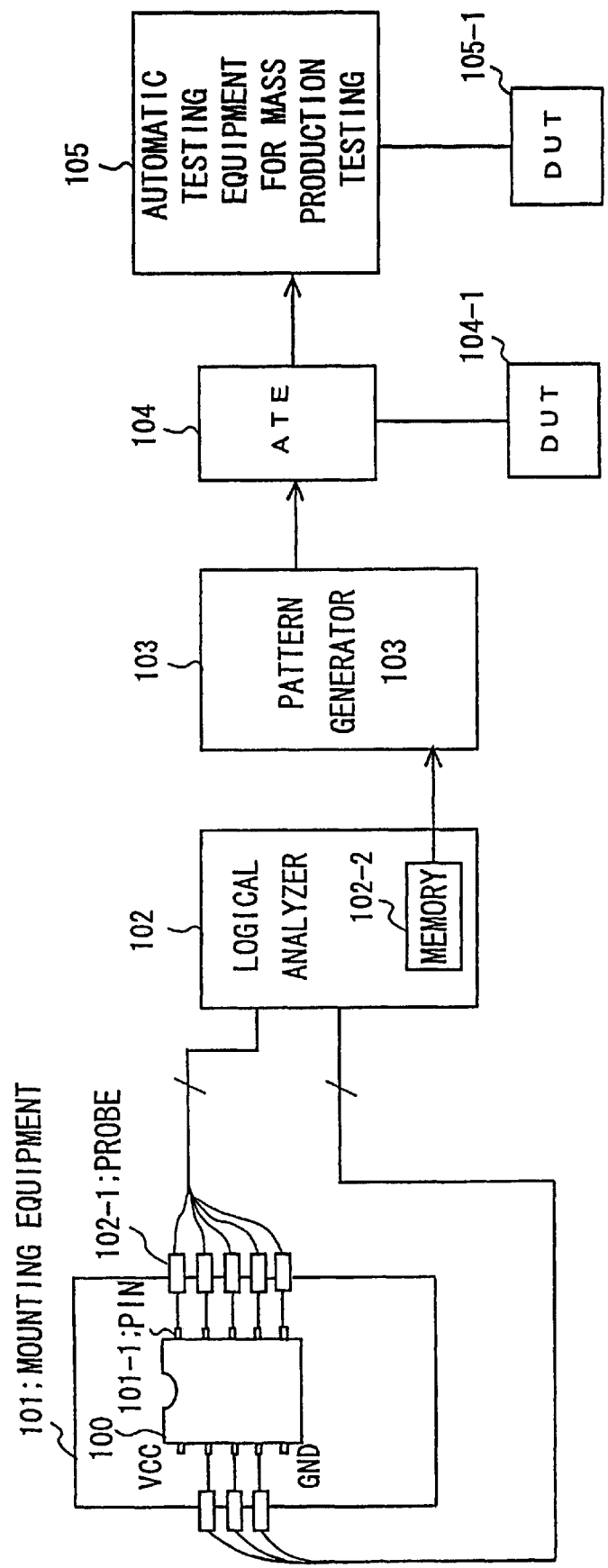
FIG. 1 shows the overall system configuration according to an embodiment of the present invention.

Preferred embodiments of the present invention are now explained. The system of the present invention includes a device for acquiring signal waveform data 102 for a time period beginning from a first time point going back retrogressive as from the time of occurrence of a malfunction of the semiconductor device and running until a second time point inclusive of a malfunctioning time of the semiconductor device, as signal waveform data at a preset group of terminals of a (first) semiconductor device, and a device for generating a test pattern usable in automatic testing equipment 103 for testing a semiconductor device as a device under test, from the acquired signal waveform data. The pattern generating device 103 generates and outputs a test pattern which is the data for the malfunctioning time that has been changed to normal data and, using a mass production test generated in the automatic testing equipment 105, conducts a mass production test on a semiconductor device which is of the same product type (or production series) as the first-mentioned semiconductor device.

The signal waveform acquisition device 102 is a logical analyzer having a memory un-it for memorizing sampled waveform data, and acquires signal waveform data of a preset terminal group of the semiconductor device 100 until, with the semiconductor device 100 mounted on the implemented equipment 100, a preset failure signal notifying the malfunction of the semiconductor device asserts itself with such failure signal as a trigger. In the signal waveform acquisition device 102, the terminal signal of the semiconductor device 100 may be sampled in a memory in a FIFO (first-in first-out) system, in synchronism with clocks supplied to the semiconductor device 100, such that, if the memory is full, the oldest data is discarded and the latest data is stored. The waveform data are consecutively sampled for a preset number of clocks when the failure signal is detected to assert itself, with the data stored in the memory being then the acquired signal waveform data.

In a preferred embodiment of the present invention, the signal waveform data acquired by the signal waveform acquisition device 102 are received and analyzed by a pattern generator 103. An output signal from the semiconductor device, corresponding to the output signal at the time of occurrence of the malfunction(s) in the semiconductor device, is compared with a pattern of expected (or predicted) values for verifying pass or failure. It is checked whether or not an input pattern required to be preset for the semiconductor device is present in the signal waveform data sampled prior to the time point of occurrence of the malfunctions. If the input pattern for condition setting is not present there, an input pattern for condition setting is generated, and the input pattern is inserted to generate a test pattern.

More specifically, the signal wave form data is input to and analyzed by the pattern generating device (generator) 103. If input setting to the semiconductor device of input data to be set in association with output data from the semiconductor device is not present in the signal waveform data, a test pattern for inputting the input data to the semiconductor device from a driver of the automatic testing equipment is inserted before (ahead of) a test pattern to be compared with the output data from the semiconductor device by a comparator of the automatic testing equipment.

More specifically, the pattern generator 103 is fed with and analyzes signal waveform data and inserts an initial setting pattern for testing the semiconductor device by an automatic testing equipment at a leading end to guarantee pattern matching.

The pattern generator 103 converts a test pattern, obtained by changing the acquired signal waveform pattern data, into a correct test pattern, as correct data of expected values for comparison by a comparator of the automatic testing equipment for output signals to the semiconductor device at the time of occurrence of malfunction in the semiconductor device.

In a preferred embodiment of the present invention, there may be provided an operation analysis device having an analyzer for analyzing the combination of signals of the semiconductor device product and operating states prescribed by the transit ion of the signals to output the results of analyses to an output device.

In a preferred embodiment of the present invention, there is provided a pattern generating device for being fed with signal waveform data from a signal waveform acquisition unit acquiring signal waveform data at a preset terminal group of the semiconductor device mounted on the implemented equipment, for a time period beginning with a first time point going back from a time of occurrence of a malfunction and running to a second time inclusive of the malfunction time, using a preset signal indicating faults the malfunction of the semiconductor device as a trigger, in connection with a preset terminal signal of the semiconductor device mounted on the implemented equipment. The pattern generating device converts the input data into a test pattern of the automatic testing equipment for inspecting the semiconductor device in the targeted automatic testing equipment. The processing of receiving and analyzing the waveform data and checking as to pass or failure by comparing the output signal of the semiconductor device for a malfunctioning time of the semiconductor device with a pattern of expected values in the automatic testing equipment, checking whether or not an input pattern required to be preset in the semiconductor device is present in signal waveform data sampled before the time point of occurrence of the malfunction, and generating, in the absence of the input pattern for condition setting a test pattern obtained by generation and insertion of the input pattern for condition setting, is realized by executing a program (program product) on a computer comprised in the pattern generating device.

If, when the signal waveform data is input and analyzed, there is not present in the signal waveform data the input setting to the semiconductor device of input data to be set in association with output data from the semiconductor device, the processing of inserting a test pattern for inputting to the semiconductor device from a driver of the automatic testing equipment before a test pattern to be compared with output data from the semiconductor device by a comparator of the automatic testing equipment is realized by executing a program (product) on a computer comprised in the pattern generating device.

The processing of inserting a test pattern for initial setting in the leading end in case of inputting and analyzing the signal waveform data and testing the semiconductor device on the automatic testing equipment is realized by executing a program on a computer comprised in the pattern generating device.

DETAILED DESCRIPTION OF PREFERRED EMBODIMENTS

For further elucidating the embodiments of the present invention, certain preferred embodiments thereof are explained by referring to the drawings.

FIG. 1 shows the system configuration of a test system for a semiconductor device embodying the present invention. Referring to FIG. 1, a preferred embodiment of the present invention shown includes a logic analyzer 102 which acquires a signal waveform of a set (group) of terminals (pins) of a semiconductor device 100 in its operating states mounted on equipment 101, with given failure information as a trigger. The preferred embodiment also includes a pattern generator 103 fed with signal waveform data (trace data), acquired by the logic analyzer 102, to convert the data into a test pattern for a target testing equipment to output the converted test pattern, and automatic testing equipment (ATE) 104 for testing the semiconductor device as a device under test (DUT) 104-1, using the test pattern output from the target testing equipment. The preferred embodiment also includes automatic testing equipment (ATE) for mass production 105 for testing a product which is the same product as the semiconductor device 100 mounted on the equipment 101.

The pattern generator 103 may be constructed by a personal computer or a workstation or a computer of the automatic testing equipment (ATE) 104.

The logic analyzer 102 includes a memory 102-2 (or a recording medium) 102-2 for memorizing acquired signal waveform data as bi-level signals. In this logic analyzer 102, acquired signal waveform data is stored in a storage unit, not shown, on the pattern generator 103, via a recording medium, measurement bus, such as GPIB, or LAN (Local Area Network) connection.

Figure 2:
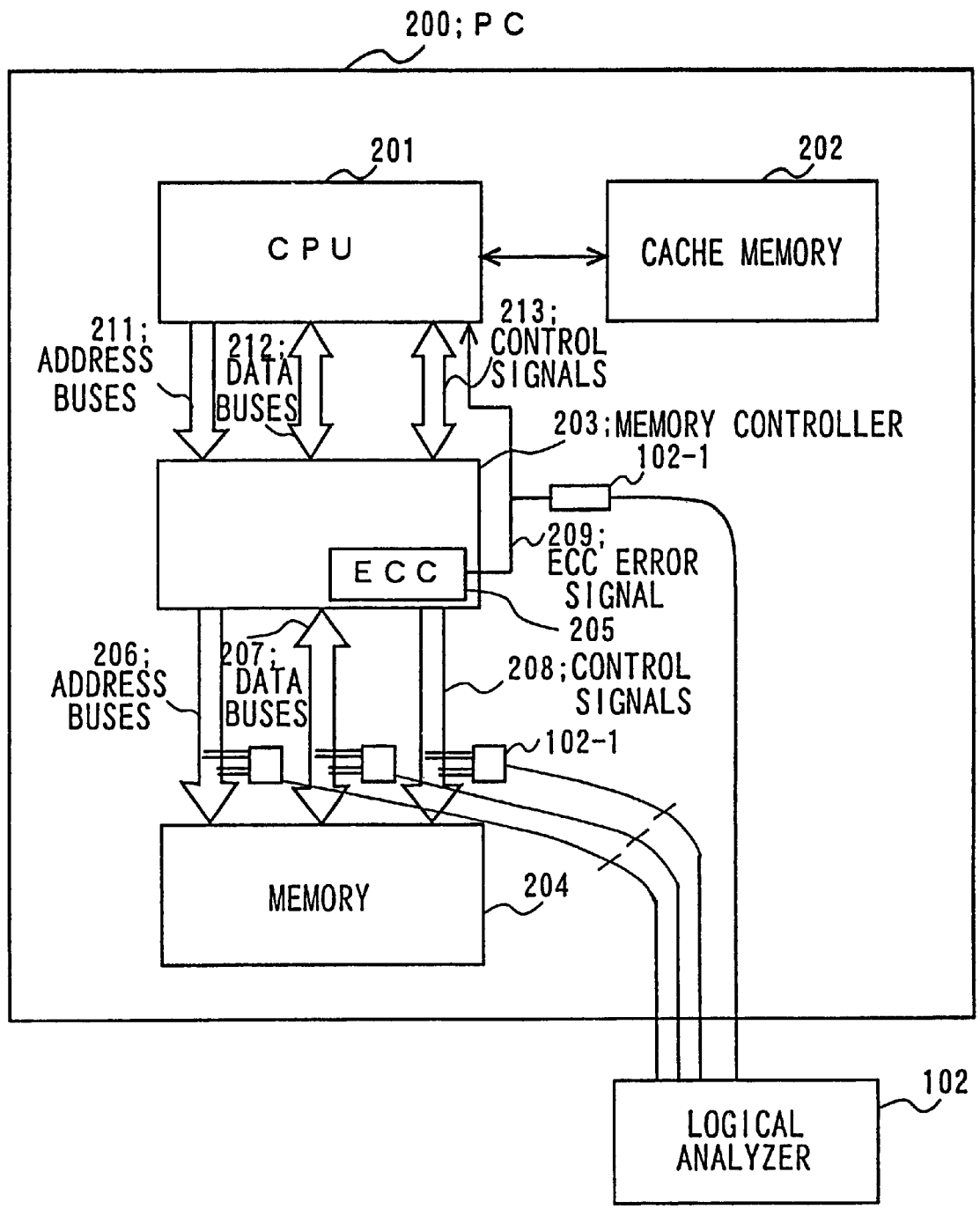
FIG. 2 shows the configuration of implemented equipment in an embodiment of the present invention and the interconnection between a semiconductor device and a logical analyzer.

FIG. 2 shows an illustrative structure of the equipment and the connection configuration between the semiconductor device mounted on the equipment and the logical analyzer 102. Referring to FIG. 2, the equipment is made up of a personal computer (PC) 200 including a CPU 201, a cache memory 202, a memory controller 203 and a memory 204. The memory controller 203 includes an error checking and correction (ECC) circuit 205 for error checking and correction of data read out from the memory 204.

In an embodiment of the present invention, if the memory 204 operating on the implemented equipment 200 is malfunctioning, the cause responsible for this trouble is checked to generate a test pattern capable of detecting the malfunction in a mass production test of memories as the same product (or production services).

Referring to FIG. 2, the logical analyzer 102 acquires, in a probe 102-1, an address 206 between the memory controller 203 and the memory 204, data 207, a control signal 208 and data (bi-level or binary data) of the signal waveform of an ECC error signal 209 from an ECC circuit 205 of the memory controller 203. In the following embodiment, clock synchronization synchronous DRAM, abbreviated herein to SDRAM, is used as the memory 203.

As is well-known, the SDRAM includes: a clock buffer fed with clock signals CLK to send out inner clocks to respective blocks, and a command decoder fed with address signals of preset bits (signals for automatic recharging and bank selection) from a control terminal/CS (chip select), /RAS (row address strobe), /CAS (column address strobe), /WE (write enable) and an address buffer. The SDRAM also includes an address buffer/register fed with and outputting address signals, a latch for holding an output control signal from the command decoder, a column address counter for generating an internal column address at the time of burst accessing, an I/O data buffer/register for data inputting/outputting to or from a DQ terminal, and a DRAM core having a structure of plural banks. Of course, the semiconductor device to which the present invention applies is not limited to the above-described SDRAM.

Figure 3:
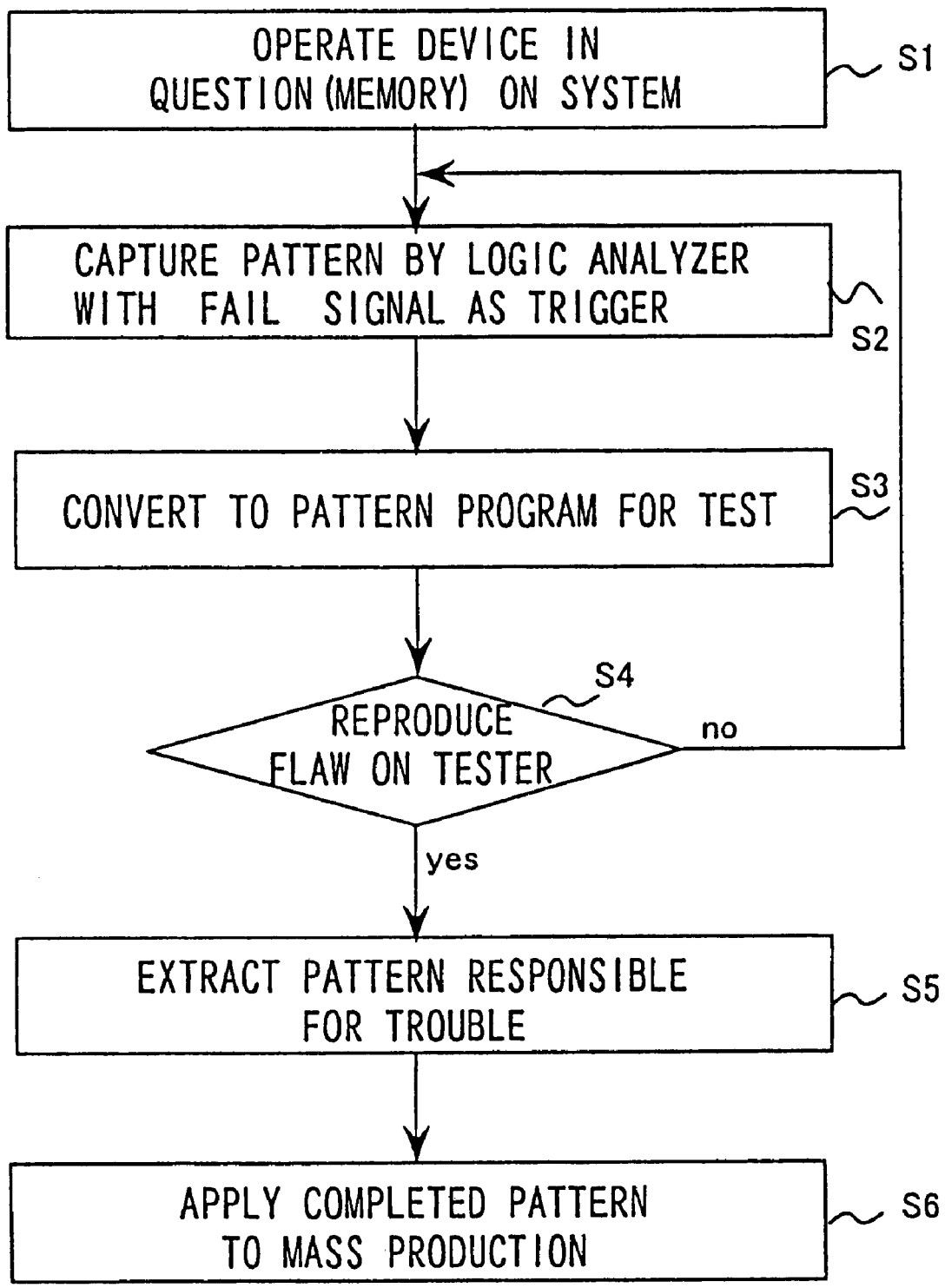
FIG. 3 is a flow diagram showing a processing sequence in an embodiment of the present invention.

FIG. 3 illustrates a typical processing sequence in an embodiment of the present invention. Specifically, FIG. 3 shows a flow diagram for generating a test pattern for mass product ion from detection of system malfunctions in the personal computer (PC) 200.

First, a memory (SDRAM) 204, on which malfunctions have been reported, is mounted on a personal computer 200 as the implemented equipment.

On the logical analyzer 102, trace data of the signal waveform of a terminal of the memory 204 is acquired. The pattern is captured, with a failure signal, such as ECC error signal 209, as a trigger (steps S1 and S2).

The so-acquired trace data is converted into a test pattern or a pattern program for target automatic testing equipment (step S3).

On the automatic testing equipment, the memory in question is tested, using a test pattern or a pattern program, to check whether or not malfunction(s) will be reproduced again (step S4).

If any malfunction is reproduced, a pattern responsible for the malfunction is extracted (step S5).

From the extracted pattern, worst conditions etc., are checked to prepare a test pattern reflecting the worst condition, with the so-prepared test pattern being then applied to amass production test (step S6). It is noted that the processing from step S4 to step S6 includes manual operations by, e.g., research or test engineers.

At step S2 of FIG. 3, the logical analyzer 102 operates synchronously with sampling clocks to sample the address signal 206 between the memory controller 203 and the memory 205, data signal 207, control signal 208 and an ECC error signal 209 of ECC circuit 205 to acquire as trace data signal waveform data for preset cycles or states until occurrence of the failure phenomenon and signal waveform data for preset cycles after occurrence of the failure phenomenon, with the transition to the failed state of the EGG error signal 209 as a trigger.

At step 83 of FIG. 3, the pattern generator 103 automatically converts the trace data, acquired by the logical analyzer 102, into a test pattern or a pattern program used in the automatic testing equipment (104 and 105 in FIG. 1).

Figure 4:
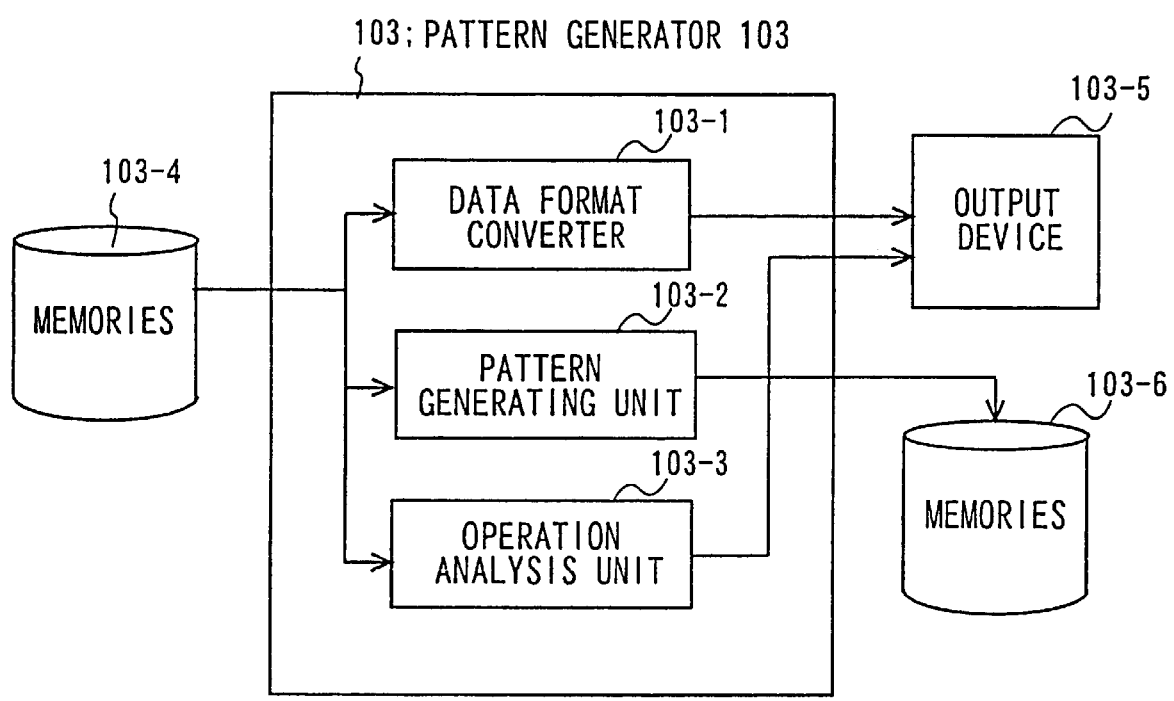
FIG. 4 shows a typical structure of a pattern generating device in an embodiment of the present invention.

FIG. 4 shows a structure of the pattern generator 103 embodying the present invention. Referring to FIG. 4, the pattern generator 103 includes a data format conversion unit 103-1, a pattern generating unit 103-2 and an operation analysis unit 103-3. FIG. 4 also shows a memory device 103-4 for memorizing the trace data acquired by the logical analyzer 102, an output device 103-5, such as a display or a printer, and memory device 103-6 for memorizing a generated test pattern as a file.

FIG. 5 shows an example in which the trace data has been output in a specified format. The trace data is acquired by the logical analyzer 102, of the signal waveform by a preset number of states going back from a time point at which the FCC error signal 209 from the EGG circuit 205 of the memory controller 203 is changed from "1" to "0".

The data format conversion unit 103-1 of the pattern generator 103 is fed from the memory device 103-4 with trace data, and divides the input data into, e.g., state numbers in decimal, command symbols, bank addresses in hexadecimal, data in hexadecimal, /CS (chip select), /RAS (row address strobe), /CAS (column address strobe), /WE (write enable), DQM (data mask), and into ECC error in binary format to output the trace data to output devices, such as terminals, printers or files. The number of digits of data or columns for data display may be output in an optional display format by changing the format definition information, such as by displaying the control signal/CS from a display column 76 in one digit in hexadecimal or by displaying an input mask/output enable signal DQM from a display column 113 in two display digits.

The command symbol is obtained by capturing address bits of /CS, /RAS, /CAS, /WE, auto-recharge or bank select, making up a control signal for the memory (SDRAM), at a rise time point of the clock signals CLK from "0" to "1", decoding the captured pattern, and by displaying the decoded results by symbols (text). This decoding processing corresponds to the decoding processing of the command decoder in the SDRAM. It is noted that PRE, ACT and READ are commands for Precharge, Active Bank and reading out data, respectively. In this case, burst readout in a scramble decoding system by a boundary address of A0 to A1 (3→2→1→0) is performed. As is well-known, the column address at the time of burst access in the SDRAM is generated man internal column address counter.

The EGG error signal 209 from the memory controller 203 is output with a delay of a preset number of states as from the occurrence of an uncorrectable error in the memory 204 comprising an SRAM. In the embodiment shown in FIG. 5, the EGG error signal 209 occurs at the ACT command (state number=−13) next to the last state of burst readout of the READ command beginning with the state number of −17. In this case, the EGG error signal 209 from the memory controller 203 is changed at the state number 0 from "1" to "0" indicating error occurrence. The logical analyzer 102 is triggering the EGG error signal 209 and samples signal waveform data for a preset number of cycles even after the EGG error signal 209 has been changed from "1" to "0" in terms of the state number 0.

Meanwhile, the number of states of the trace data (number of columns) is voluminous, such as on the order of tens of thousands or even million of rows. It is therefore difficult to print the trace data on a printer or on a terminal, or to analyze the data manually for extracting the operating state on the implemented equipment of a semiconductor device. On the other hand, it is extremely time-consuming to increase the load on an analysis engineer.

Thus, in a preferred embodiment of the present invention, the pattern generator 103 includes an operation analysis unit 103-3 for analyzing the trace data and extracting the operation information of the semiconductor device, as shown in FIG. 4. Of course, the operation analysis unit 103-3 may be operated on a computer different from the pattern generator 103.

From the trace data of the semiconductor device (SDRAM), acquired by the logical analyzer 102, the operation analysis unit 103-3 checks various timings of the SDRAM and analyzes issuing states of various commands.

Figure 6:
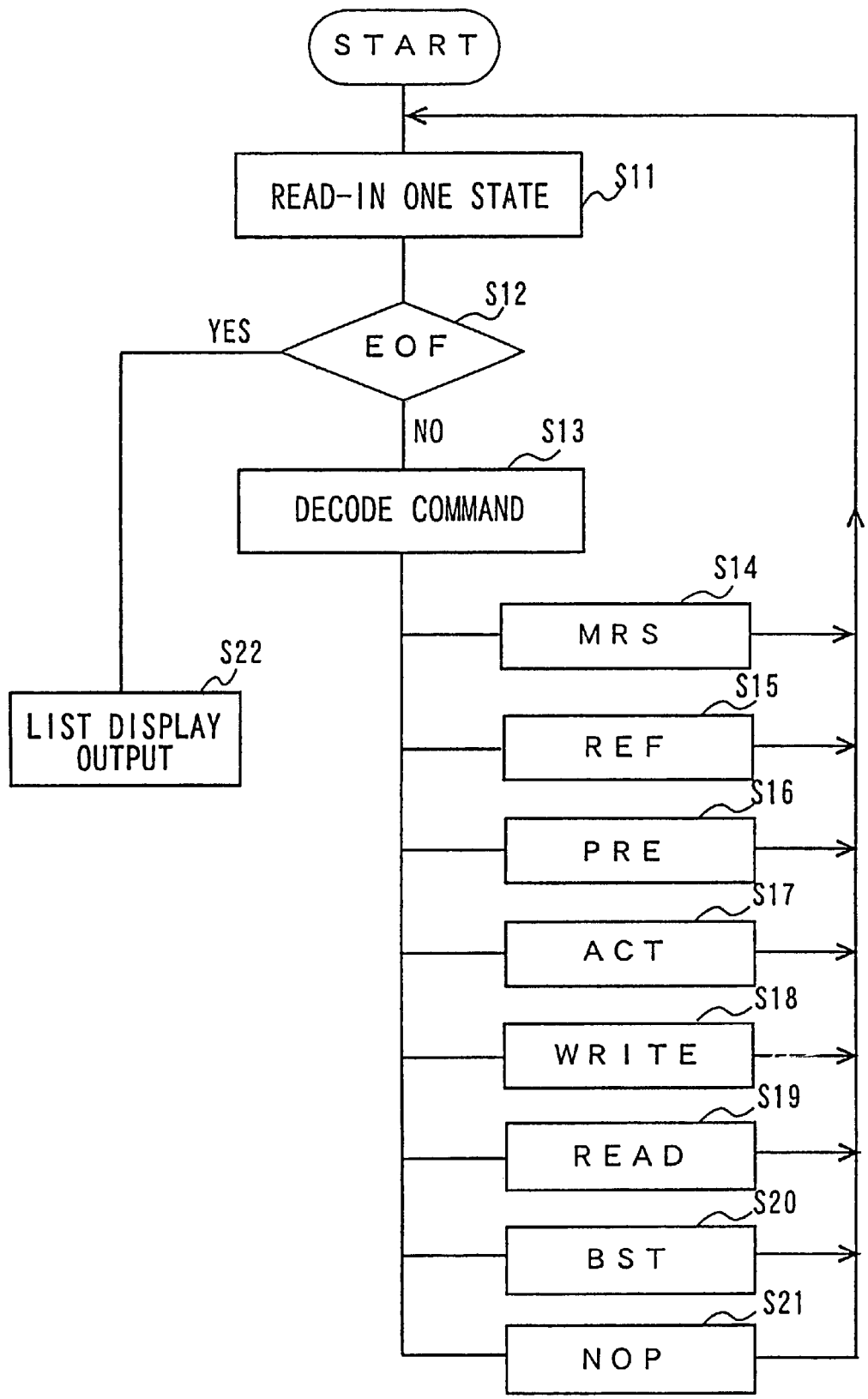
FIG. 6 is a flow diagram for illustrating the processing of an operation analysis unit of an embodiment of the present invention.

FIG. 6 shows a processing sequence of the operation analysis unit 103-3 in a preferred embodiment of the present invention.

Referring to FIG. 6, the trace data is read in state by state from the memory device 103-4 (step S11) and a command pattern is decoded from the values of /CS, /RAS, /CAS and /WE (step S13).

Depending on the command decoding results, processing branches to MRS (mode register set), REF (refresh), ACT (bank active), PRE (recharge), WRITE (write), READ (read), BST (burst stop) and NOP (non-operation) at steps S14 to S21, to store the location (or position) of each state. If the command meets the retrieval end condition, the number of states is computed and stored for management. In-reading in from the memory device 103-4, if EOF (end-of-file) is encountered (YES at step S12), the results of command analyses are collected to display a list of the number of times of occurrences of the respective commands (step S22).

FIG. 7 shows, in a tabulated form, the processing sequence for analyzing the trace data to indicate the various timing information, that is tREF (refresh time; from REF to REF)

tRC (from ACT to refresh or ACT command period)

tRAS (from ACT to PRE command period of the same bank)

tRP (from ACT to ACT command period of another bank)

tPRD (from ACT to ACT command period of another bank)

tRCD (delay time from ACT to the WRITE/READ command of own bank)

tDPL (from data input to PRE command period: from WRITE to PRE command of own bank).

tDPL (from WRITE (AP) to ACT command/REF command of own bank)

WRT to WRT (from WRITE to WRITE command period)

RED to RED (from READ to READ command period)

RED to WRT (from READ to WRITE command)

in a tabulated form. For example, in analyzing tREF (refresh time; from REF to REF), the start position (number of states) is stored at the time of REF command retrieval, when retrieving the REF command and, the number of clocks is calculated from the difference in the numbers of states at the end time of REF command retrieval. In tRAS, the start position (number of states) is stored at the time of ACT command retrieval to compute the number of clocks up to the PRE command of the same bank.

FIG. 8 shows typical results of analyses of the trace data shown in FIG. 5 by the operation analysis unit 103-3 of an embodiment of the present invention, that is, the minimum period (min) and the maximum time (min) for each of the timings along with the information on the state number of appearance (occurrence by way of output results of the number of times the commands are used).

A pattern conversion unit 103-2 of the pattern generator 103 analyzes addresses, data, control signals and clock signals, from state to state, from the trace data read out of the memory device 103-4 and converts the addresses, data, control signals and write data into an input pattern configured for a driver of automatic testing equipment, while converting the readout data into a pattern of expected values to be supplied to a comparator of an automatic testing equipment, thereby generating a pattern program (or test pattern).

FIG. 9 shows an illustrative pattern program generated in the pattern generating unit 103-2. Meanwhile, the pattern program shown in FIG. 9 is a pattern program for testing equipment (MEMORY TESTER) T5881 (trade name of a product manufactured by Advantest Inc.). In FIG. 9, the definition sentence, such as a pin definition, placed ahead of the pattern program, is omitted. As for the syntax of the Pattern program, reference is made to an operating manual etc. of the same product. This pattern program is mounted on a pattern processor of automatic testing equipment, under control by a test program executed by the automatic testing equipment. The pattern processor then executes the pattern program, under microprogram control, to send an input pattern (force data) form a driver to the device under test (DUT) to compare an output from the device under test (DUT) with a pattern of the expected values by a comparator.

Meanwhile, according to the present invention, the trace data acquired by the logical analyzer 102 is data at the time of the malfunction of the semiconductor device. So, if a test pattern (test vector) is to be generated by the pattern generator 103, the acquired malfunctioning data cannot be directly used as a pattern of expected values.

So, in a preferred embodiment of the present invention, a normal data portion is substituted for a malfunctioning data portion among trace data acquired by the logical analyzer 102 and output from the memory 204 (see FIG. 2) to prepare a test pattern having the specific normal data portion as a pattern of expected values. If the normal data portion to be substituted for the malfunctioning data portion is known from the structure of the program at the time of analyses of the troubles in the memory 204 or from the processing flow, the normal data portion is substituted for the pattern of a test vector for the defective location. Alternatively, the test pattern is run on automatic testing equipment and data of expected values are sequentially varied to detect the data of expected values coincident with read-out data from the SDRAM as a measured device to obtain normal data.

In the pattern generating unit 103-2, a read strobe signal (RF) is automatically set for a test vector which specifies the results of comparison in a comparator of an automatic testing equipment of output values of the device under testing.

The trace data, which is the terminal waveform of the SDRAM acquired in the logical analyzer 102, is past trace data taken from a preset number of states prior to the time of occurrence of the malfunction, corresponding to several clock cycles sliced out of the, operation waveform on the actual implemented equipment. The signal waveform data positioning ahead of the leading end data acquired as trace data is cutoff. So, in an embodiment of the present invention, a test vector required for matching to a test pattern generated on conversion of the trace data into a pattern is automatically generated and inserted into a test pattern.

For example, in an SDRAM, a test pattern for carrying out as a power-on-reset sequence (initialization sequence), for the SDRAM, a processing such as:

initialization of a mode register (mode register setting)

writing in a background or writing of specified bit data (which take into account results of comparison of an automatic testing equipment), is inserted as addition to a position ahead of the first test vector of the test pattern generated on conversion form the trace data. The writing of the specified bit data is now explained.

In the trace data acquired by the logical analyzer 102, there are data readout commands. There are, however, occasions where the data write operation for the readout address is not contained in the test pattern. If such trace data is converted into the test pattern, data with addresses in which data are not written in the SDRAM are readout, so that correct tests cannot be executed on the automatic testing equipment.

It is assumed that, for example, if data readout with a burst length of 4 is performed by the READ command as from an address #7 from the SDRAM, it is assumed that no commands for writing bit data in the addresses #4, #5, #6 and #7 of the SDRAM are contained prior to the time point of issuing READ commands in the trace data of the terminal waveform of the SDRAM. In such case, if the SDRAM test is to be executed, using a test pattern corresponding to the READ command, a test pattern corresponding to the READ command is applied to the SDRAM as a device under test (DUT) by an automatic testing equipment, and the SDRAM, as the device under test, outputs readout data from the address #7 to the comparator of the automatic testing equipment, responsive to the test pattern, the read-out data is not necessarily coincident with the data of the expected values.

So, in the preferred embodiment of the present invention, if no writing in the readout address is present in the trace data, a writing sequence for the address is added ahead of the readout sequence by the READ command.

Figure 10:
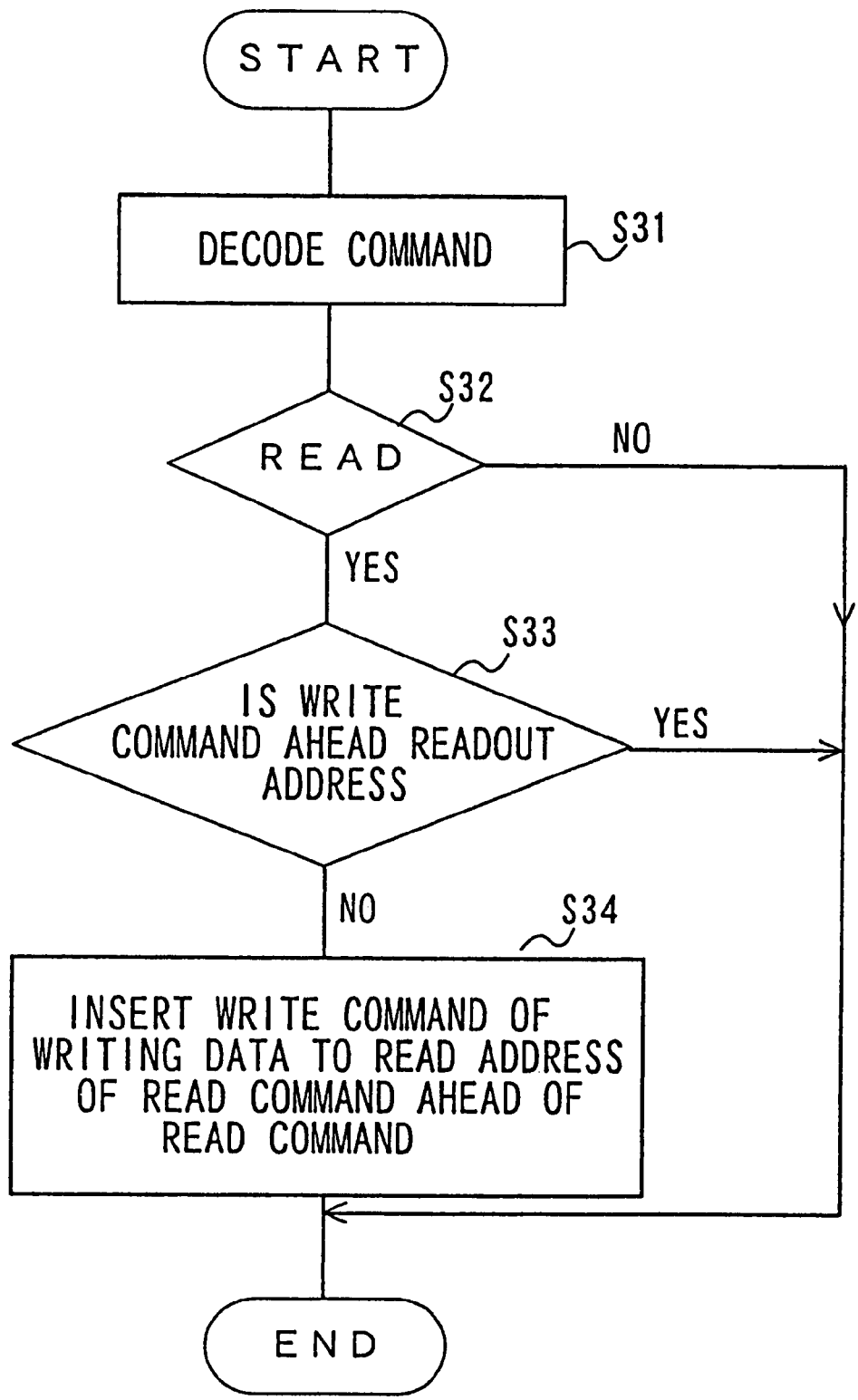
FIG. 10 is a flow diagram showing a typical sequence of the pattern generating process according to an embodiment of the present invention.

FIG. 10 is a flow diagram showing this processing sequence. The trace data is input to decode a command (step S31). If the command is a READ command (YES at step S32), it is checked whether or not the writing in the readout address is present in the trace data (step S33). If the result of check is negative, the write sequence for the address is added before the readout sequence of the READ command (step 534).

If, in the READ command, no WRITE command for the address is present in the trace data, before data readout of data with a burst length equal to 4 from the address #7, patterns for writing readout data from the address #7 by the READ command in the trace data sampled by the logical analyzer in a burst length 4 (PRE, ACT, and WRITE commands) are automatically generated and inserted at the positions ahead of the READ command, e.g., at the position (s) directly following the initialization in the pattern program.

It is sufficient if the setting of input data for output data of the device under test (readout data) (setting of the write data) is made only in such locations where an output of the device under test is compared to the expected values, and input data (write data) need not be set for the masking location of the results of comparison of the device under test, i.e., non-specified location. Alternatively, any optional background data (field data) may be written.

Using this pattern program, an SDRAM is tested on testing equipment to check whether or not failure occurs at the same location as that on actual implemented equipment. If such failure occurs, that is, if a malfunction is reproduced, this test pattern is applied to a pattern program for testing equipment for mass production.

Using a system according to the present invention, malfunction of an SDRAM has been analyzed as an example. The trace data by the logical analyzer 102 is shown in FIG. 5.

Figure 11A:
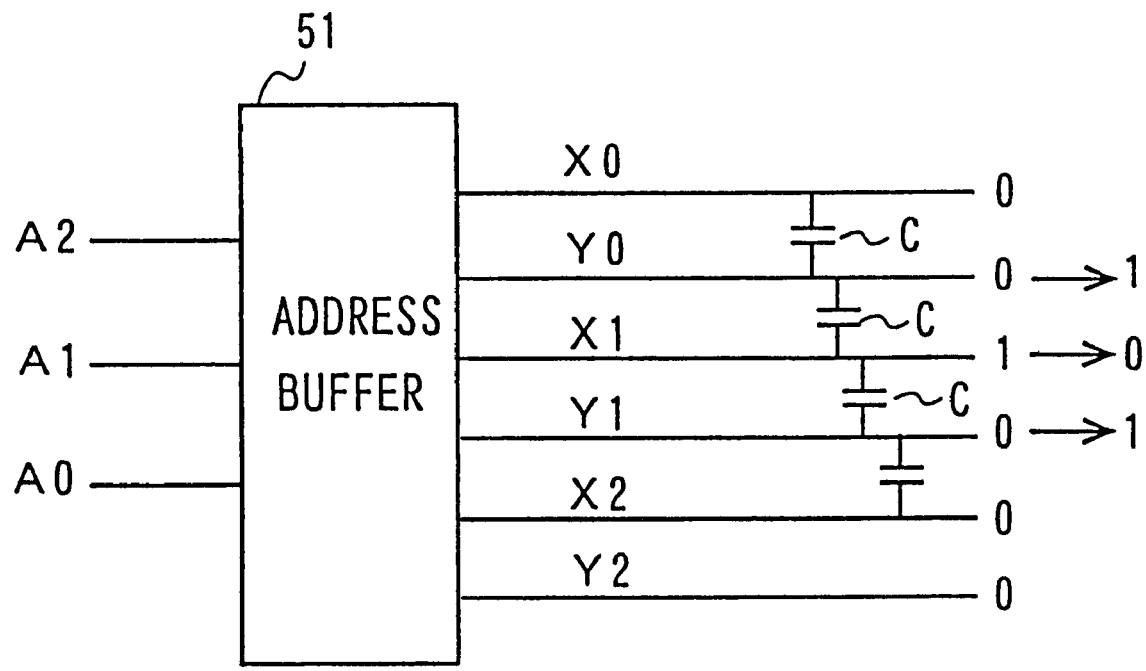
FIG. 11a is a schematic view for illustrating malfunctions in a semiconductor device as detected in an embodiment of the present invention.
Figure 11B:
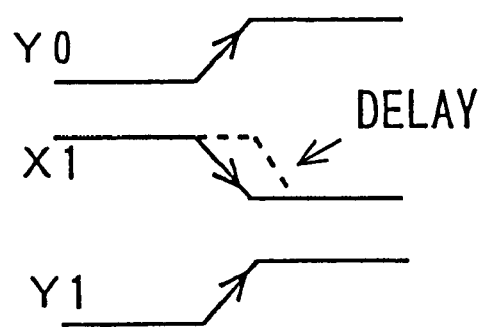
FIG. 11b shows signal waveforms.

FIG. 11 schematically illustrates the malfunction of an SDRAM and the principle of the "malfunction" of the state number −13 of FIG. 5.

If, in address signals output from an address buffer 51, in which X (row) addresses $X_i$ run parallel to Y(column) addresses $Y_i$, respectively, transition from "1" to "0", of $X_1$ temporally overlaps with the transition in the opposite direction to $X_1$, that is from "0" to "1" of $Y_0$ and $Y_1$, due to capacitance coupling across Y-address signals $Y_0$ and $Y_2$ lines adjacent to both sides of the X address $X_1$, the transition time from "1" to "0", of $X_1$ is delayed (see FIG. 11b) to cause failure in rising of the word line of the X-decoder and consequent accessing to erroneous addresses. Otherwise, accessing troubles would occur due to skewing of the sub-word line, as explained later on.

For reproducing the operational troubles of the state number −13 of the trace data shown in FIG. 5, it is sufficient if a pattern sequence as shown in FIG. 12 is accorded as a pattern sequence of command and address signals to the SDRAM. The X-address #5 and the Y-address #3 of the ACT command in FIG. 12 are used for reproducing the state number −13 of the trace data shown in FIG. 5.

In the READ of the state number −17 of the trace data shown in FIG. 5 (corresponding to READ in FIG. 12), "address" is given. In the scrambling mode, the SDRAM generates #3, #2, #1 and #0 (burst length 4), with the state numbers of −17, −16, −15 and −14, from the internal address counter. An ACT command is input at the state number −13, with the internal column address counter being reset to $(Y_1, Y_0)=(1, 1)$ (=#3).

In the ACT command of the of the state number −13 of the trace data shown in FIG. 5 (corresponding to READ of FIG. 12), the X-address $X_1, X_0$ is set to (1, 0)=#2, by the value of the external address signal, such that, incidentally, transition of $X_1$ from "1" to "0" is overlapped with the transition in the reverse direction, that is the transition of $Y_0, Y_1$ from "0" to "1".

This is based on the fact that, in the state number −14, the address bus is incidentally set to in hex (with the lower two bits of the X-address being #2), while the address bus is set to by an ACT command of the next state, thus enabling the failure to be detected.

Figure 13:
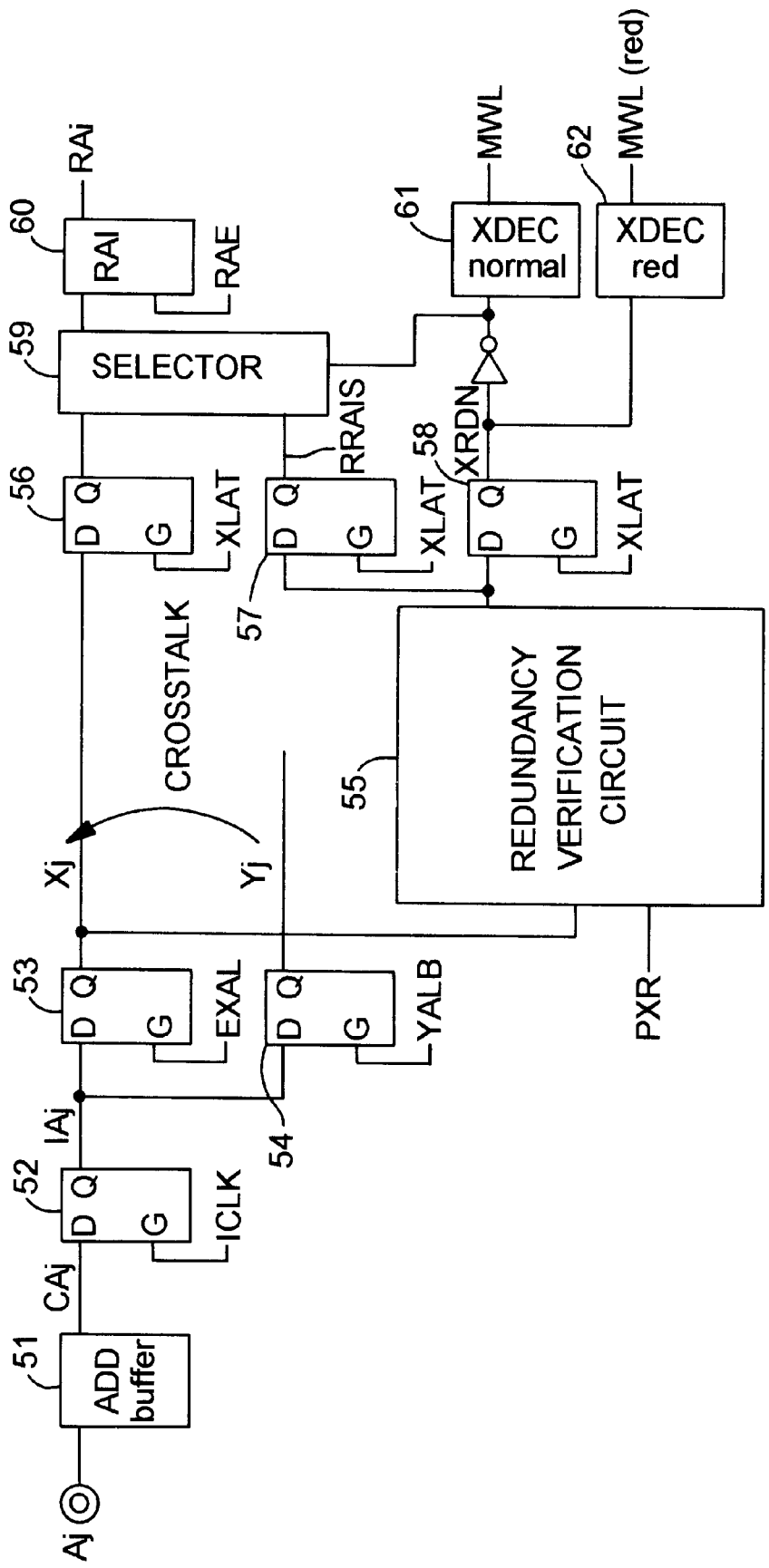
FIG. 13 shows a portion of a DRAM structure used in an embodiment of the present invention.

FIG. 13 schematically shows a typical structure of an SDRAM where the above-mentioned operational malfunction occurs. Meanwhile, the SDRAM, having the circuit structure shown in FIG. 13, is of a memory cell array comprised of a sole main word line MWL from an X-decoder and plural sub-word lines RAi. A memory cell selected by a set of the main word line MWL from the X-decoder (XDEC) 61 (or a redundant X-decoder 62) and a sub-word line RAi from an circuit 60 is accessed. Also, there is a redundant word line configuration for rescuing malfunctioning cells, such that, if an address of a malfunctioning memory cell is accessed, a redundancy circuit 55 switches the main word line to that from the redundant X-decoder 62. It is noted that the SDRAM having the circuit structure shown in FIG. 13 is known to those skilled in the art.

In FIG. 13, outputs $X_i, Y_i, \ldots$ of latches 53, 54, latching the internal address IAj by a signal EXAL, correspond to $X_0$, $Y_0, \ldots$ shown in FIG. 11.

The schematics of the signals shown in FIG. 13 are as follows:

Aj is an external -address signal sent to the SDRAM;

CAj is an output of an address buffer (ADD buffer) 51, and is an external address signal Aj (LVTTL level) converted in level to an internal CMOS level;

ICLK is an internal clock generated in synchronism with an external clock CLK;

IAj is an internal address signal which is an external address signal Aj latched by a D-flipflop 52 with a clock CLK;

EXAL is a latch timing signal which latches an X-address by a d-flipflop 53 when capturing the X-address (ACT command);

YLAB is a latch timing signal which latches a Y-address by a d-flipflop 54 when capturing the Y-address (WRITE, READ commands);

XLAT is a signal which latches an X-address of each bank;

RAE is an activation signal of a RAI circuit 50;

RAi is a sub-word selection signal, there being provided, e.g., plural sub-word lines per main word line.

PXR is an activation signal of a redundancy verification circuit 55;

MWL is a normal main word line output from an (normal) X-decoder 61;

MWL (red) is an output signal from the redundant X-decoder 62; XRDN is an output signal from the redundancy verification circuit 55, and selects a redundancy main word MWL (red) in selecting a redundant cell, while normally selecting a normal main word MWL.

The PRAIS is a signal input to the RAI circuit and which selects a redundancy sub-word line connecting to the redundancy main word.

The selector 59 selects the PRAIS when XRDN is active, whereas selecting Xi and sending it to the RAI circuit 60 when XRDN is active.

If, in the configuration shown in FIG. 13, signals $Y_{i-1}$, and $Y_1$, on both sides of a signal $X_i$ undergo transition simultaneously as and in the reverse direction to the transition of the signal $X_i$ which undergoes transition from "1" to "0", due to cross talk between $Y_{i-1}$ and $X_i$ running parallel to each other or to cross talk between $X_i$ and $Y_i$, transition of the signal $X_i$ is delayed. If, in this case, the malfunctioning address, that is the address where transition of $X_i$ from "1" to "0" is delayed, is a normal address, outputting to the redundancy verification circuit 55 is delayed, such that selection of the normal main word MWL is delayed to shorten the time from the selection of MWL to the selection of RAI. This leads to shortage in the voltage rise (boot) level of MWL and to failure in address selection. On the other hand, if the malfunctioning address is a redundancy address, it is verified to be a normal address by the redundancy verification circuit 55, such that the normal main word MWL is selected. Since the memory cell of this normal address includes a malfunctioning cell, it is converted to a redundancy word, such that a malfunctioning cell is accessed by selection of the normal main word and hence a malfunctioning cell is selected to lead to operational failure in the SDRAM.

During the time of failure in the operating state of the SDRAM on implemented equipment, signal waveform data is acquired, the signal waveform data at the time of occurrence of the malfunction was automatically converted into a test pattern on an automatic testing apparatus, and the SDRAM was tested on this automatic testing apparatus. In this manner, the same malfunctions as those appearing on the implemented equipment could be reproduced.

The combination of the above-mentioned input patterns or the malfunctions of the semiconductor device due to capacitative coupling between neighboring wirings were not detected in a memory test carried out at the time of mass production tests or memory tests at the time of booting the implemented equipment, i.e., a personal computer. Specifically, these malfunctions were incidentally detected by a program executed on implemented equipment (personal computer). It has been verified that, according to the present invention, the time needed from the detection of the system malfunctions to the generation of a test pattern and reproduction of the malfunctions on the automatic testing apparatus can be reduced appreciably.

By using this test pattern as a test pattern for mass production and accordingly carrying out the mass production testing of the SDRAM, malfunctions of the semiconductor device detected by the combination of pattern sequences can be detected prior to product shipment.

In the above embodiment, description has been made of an SDRAM as a typical example of the semiconductor device. It is however to be noted that the present invention may be applied to a variety of logical integrated circuits or memories, without being limited to the SDRAM.

Although an embodiment of acquiring the terminal waveform of the semiconductor device mounted on an actual implemented equipment using a logic analyzer has been described in the foregoing, it is possible to sample signals of terminals of the semiconductor device by comparing the signals at the terminals of the semiconductor device to a fixed expected value, such as "0" by a comparator of a pin electronics card of the automatic testing equipment for sampling the signals at the terminals of the semiconductor device. In this case, the comparator output is pass/fail according to the signals at the terminals of the semiconductor device are "0"/"1". The operation as the logic analyzer can be realized by associating this information with binary signals.

The meritorious effects of the present invention are summarized as follows.

According to the present invention, the following meritorious effects may be realized:

The first effect of the present invention is that the semiconductor product and the implemented equipment carrying the semiconductor device may be improved in reliability.

The reason is that the present invention is configured so that a test pattern enabling the detection of malfunctions in a semiconductor device during the operation on the implemented equipment in advance is generated and used in conducting amass production test of semiconductor devices.

The second effect of the present invention is that analyses of the device operation up to malfunctions on the implemented equipment are facilitated.

The reason is that, in the present invention, the information on the operation of the semiconductor device is extracted and output from trace data.

The third effect of the present invention is that, by automatically generating a test pattern with a matched pattern sequence of the input and output patterns, the test pattern may be improved in accuracy, quality and in reliability.

The reason is that the present invention is configured so that it is analyzed in the trace data whether or not data setting necessary for read-out data from the semiconductor device and, if the necessary data setting is absent in the trace data, a test pattern for making the data setting is inserted automatically.

It should be noted that other objects, features and aspects of the present invention will become apparent in the entire disclosure and that modifications may be done without departing from the gist and scope of the present invention as disclosed herein and claimed as appended herewith.

Also it should be noted that any combination of the disclosed and/or claimed elements, matters and/or items may fall under the modifications aforementioned.

What is claimed is:

1. A method for testing a semiconductor device comprising:
   a first step of acquiring signal waveform data from a first semiconductor device for a period of time in which the semiconductor device is malfunctioning with relation to a preset terminal signal of said semiconductor device;
   a second step of generating a test pattern from the acquired signal waveform data, said test pattern being usable in an automatic testing device adapted for testing said semiconductor device as a device to be measured, and comprising data for the malfunctioning time changed into normal data; and
   a third step of testing a semiconductor device of a same series of production as the first semiconductor device as a semiconductor device to be measured using the so-generated test pattern in said automatic testing device.

2. The semiconductor device testing method as defined in claim 1 wherein, in said second step data for malfunction is changed into normal data to prepare a pattern of expected values for an output signal of said semiconductor device, it is checked whether or not setting of an input signal to said semiconductor device is present in said test pattern, and wherein, if the setting is not present in said test pattern, a test pattern for setting said input signal to said semiconductor device is automatically inserted.

3. The semiconductor device testing method as defined in claim 1 further comprising:

a step of checking, using the test pattern generated in said second step, by the automatic testing device, whether or not the malfunction of said semiconductor device is reproducible.

4. A method for testing a semiconductor device comprising:

a first step of acquiring signal waveform data from a first semiconductor device for a period of time in which the semiconductor device is malfunctioning with relation to a preset terminal signal of said semiconductor device;

a second step of generating a test pattern from the acquired signal waveform data, said test pattern being usable in an automatic testing device adapted for testing said semiconductor device as a device to be measured, and comprising data for the malfunctioning time changed into normal data; and a third step of testing a semiconductor device of a same series of production as the first semiconductor device as a semiconductor device to be measured using the so-generated test pattern in said automatic testing device, wherein, in said first step, an implemented equipment mounting said semiconductor device is run in operation and signal waveform data of a preset group of terminals of said semiconductor device is acquired using a logical analyzer employing a preset failure signal indicating the malfunction of said semiconductor device as a trigger.

5. A method for generating a test pattern comprising:

acquiring signal waveform data from a first semiconductor device for a period of time in which the semiconductor device is malfunctioning with relation to a signal at a preset terminal of said semiconductor device; and preparing a test pattern usable in an automatic testing device adapted for testing said semiconductor device as a device to be measured, from the acquired signal waveform data, said test pattern comprising data for the malfunctioning time changed into normal data;

wherein data for malfunction is changed into normal data to prepare a pattern of expected values for an output signal of said semiconductor device, it is checked whether or not setting of an input signal required in association with the output signal of said semiconductor device is present in said signal waveform pattern, provided that if the setting is not present in said test pattern, a test pattern for setting said input signal to said semiconductor device is automatically inserted.

6. A computer readable program product comprised of a pattern generating device to execute a process, said pattern generating device comprising a storage unit receiving and memorizing signal waveform data from a first semiconductor device acquired for a time period in which the semiconductor device is malfunctioning in relation to a preset terminal signal of said semiconductor device mounted on implemented equipment, said waveform data acquired in response to a preset signal indicating the malfunction of said semiconductor device as a trigger, wherein said pattern generating device generates from said signal waveform data a test pattern for an automatic testing device for testing said semiconductor device as a device to be measured, said test pattern being data for malfunctioning time changed into normal data, said process comprising the steps of:
  (a) receiving and analyzing said waveform data,
  (b) checking as to pass or failure by comparing the output signal of said semiconductor device for a malfunctioning time of said semiconductor device with a pattern of expected values in said automatic testing device,
  wherein the step (b) comprising:
    (b1) checking whether or not an input pattern required to be preset in advance in said semiconductor device is present in signal waveform data sampled temporally before the time point of occurrence of said malfunction, and
    (b2) generating, in the absence of the input pattern for condition setting, a test pattern and inserting of said input pattern for condition setting.

7. The program product as defined in claim 6 wherein said processing comprises the steps of: upon receiving said signal waveform data and analyzing, inserting a test pattern for inputting said input data to said semiconductor device from a driver of the automatic testing device ahead of a test pattern to be compared, in the absence, in said signal waveform data, of input setting to said semiconductor device of input data to be set in association with output data from said semiconductor device, and outputting output data from the semiconductor device by a comparator of said automatic testing device.

8. A medium carrying the program product defined in claim 7.

9. The program product as defined in claim 6 wherein the processing comprises:

inserting a test pattern for initial setting used in testing said semiconductor device in said automatic testing device in a leading end.

10. A medium carrying the program product defined in claim 9.

11. A medium carrying the program product defined in claim 6.

* * * * *